United States Patent [19]
Yuge et al.

[11] Patent Number: 5,278,857
[45] Date of Patent: Jan. 11, 1994

[54] INDIUM GALLIUM ALUMINUM PHOSPHIDE SILICON DOPED TO PREVENT ZINC DISORDERING

[75] Inventors: Shozo Yuge, Kawasaki; Hideaki Kinoshita, Yokohama, both of Japan

[73] Assignee: Kabushiki Kaisha Toshiba, Kawasaki, Japan

[21] Appl. No.: 905,182

[22] Filed: Jun. 26, 1992

Related U.S. Application Data

[63] Continuation of Ser. No. 596,293, Oct. 15, 1990, abandoned.

[30] Foreign Application Priority Data

Oct. 16, 1989 [JP] Japan ................... 1-268782

[51] Int. Cl.$^5$ .................. H01S 3/19; H01L 33/00
[52] U.S. Cl. ........................ 372/45; 257/13; 257/22; 257/97; 257/102
[58] Field of Search ........... 357/16, 17, 4; 372/45; 257/13, 18, 22, 96, 97, 101, 102, 103, 76

[56] References Cited

U.S. PATENT DOCUMENTS

| | | | |
|---|---|---|---|
| 4,972,238 | 11/1990 | Tanaka | 372/45 |
| 4,974,231 | 11/1990 | Gomyo | 372/45 |
| 5,020,068 | 5/1991 | Isshiki | 372/45 |

FOREIGN PATENT DOCUMENTS 0334637  9/1989  European Pat. Off. .

OTHER PUBLICATIONS

Y. Kawamura, et al., "0.66 μm Room-Temperature Operation of InGaAlP DH Laser Diodes Grown by MBE," Electronics Letters, vol. 19, No. 5, Mar. 3, 1983, pp. 163–165.

K. Kobayashi, et al., "661.7 nm Room-Temperature CW Operation of AlGaInP Double Heterostructure Lasers With Aluminum-Containing Quaternary Active Layer," Electronics Letters, vol. 22, No. 24, Nov. 21, 1985, pp. 1162–1163.

S. Kawata, et al., "621 nm CW Operation (0° C.) of AlGaInP Visible Semiconductor Lasers," Electronics Letters, vol. 22, No. 23, Nov. 6, 1986, pp. 1265–1266.

M. Watanabe, et al., "Optical Tristability Using a Twin-Stripe Laser Diode," Applied Physics Letters, vol. 50, No. 8, Feb. 23, 1987, pp. 427–429.

K. Kobayashi, et al., "AlGaInP Double Heterostructure Visible-Light Laser Diodes with a GaInP Active Layer Grown by Metalorganic Vapor Phase Epitaxy", IEEE Journal of Quantum Electronics, vol. QE-23, No. 6, Jun. 1987, pp. 704–711.

*Primary Examiner*—William D. Larkins
*Attorney, Agent, or Firm*—Finnegan, Henderson, Farabow, Garrett & Dunner

[57] ABSTRACT

In a semiconductor light-emitting element having a double hetero junction structure of an InGaAP system an n-type dopant, which does not change a crystal structure, is doped in an $In_{1-y}(Ga_{1-x}Al_x)_yP$ ($0 \leq x < 1$, $y \approx 0.5$) active layer, so that an n-type active layer (4), is formed between a p-type InGaAlP cladding layer (5), which has band-gap energy that is larger than that of the active layer (4), and an n-type InGaAlP cladding layer (3), thereby preventing the dopant of the P-type InGaAlP cladding layer (3) from being dispersed into the active layer (4). Thus, the oscillation wavelength of the light-emitting element is not shifted to a short wavelength, and the threshold current of the oscillation is not increased thereby providing an element which can improve yield and reliance.

7 Claims, 4 Drawing Sheets

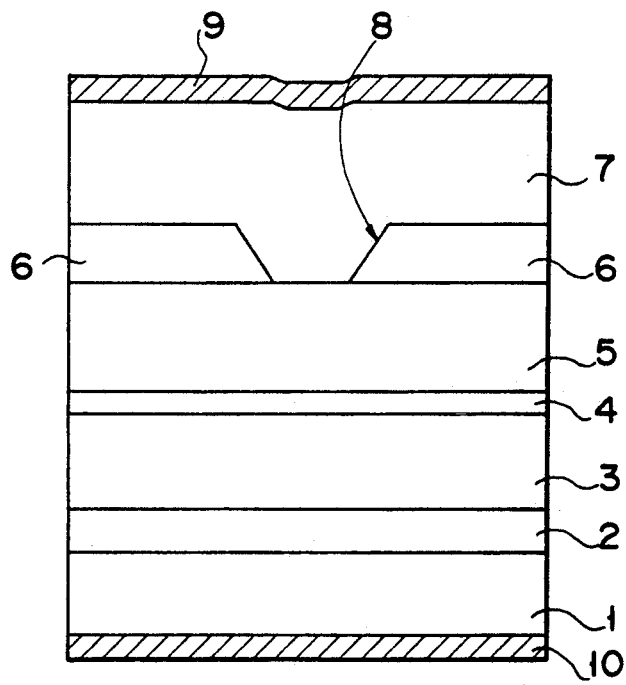
F I G. 2

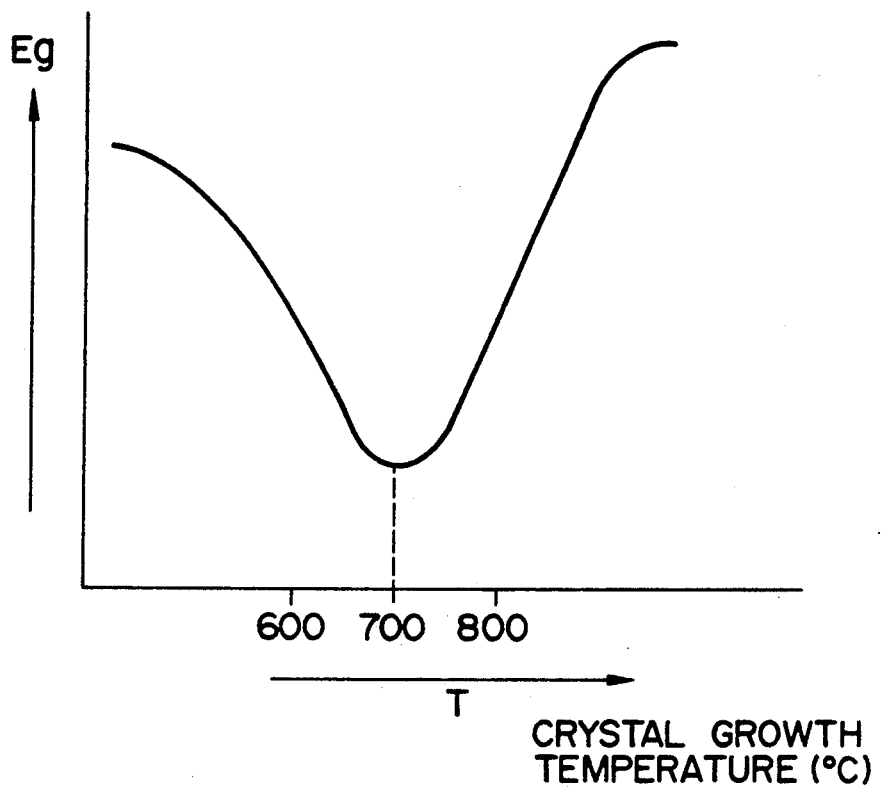
F I G. 5

INDIUM GALLIUM ALUMINUM PHOSPHIDE SILICON DOPED TO PREVENT ZINC DISORDERING

This application is a continuation of application Ser. No. 07/596,293 filed Oct. 15, 1990, now abandoned.

BACKGROUND OF THE INVENTION

1. Field of the Invention

The invention relates to a semiconductor light-emitting element having a double hetero structure and, more particularly to a semiconductor light-emitting element such as a high output laser diode having an active layer formed of InGaAlP crystal and a light-emitting wavelength of about 600 nm.

2. Description of the Related Art

Semiconductor lasers of InGaAlP system have been widely used in reading light sources which are employed in a bar-code reader or a laser printer, etc. FIG. 1 is a cross sectional view showing an inner stripe (IS) structure as an example of a conventional laser of a InGaAlP system having a double hetero junction structure manufactured by a metalorganic chemical vapor deposition method (MOCVD) or a molecular beam epitaxial method (MBE).

In FIG. 1, as a first growth, an n-type GaAs buffer layer 22, an n-type $In_{1-y}(Ga_{1-s}Al_s)_y P$ cladding layer 23, an undopped $In_{1-y}(Ga_{1-x}Al_x)_y P$ active layer 24, a p-type $In_{1-y}(Ga_{1-s}Al_s)_y P$ cladding layer 25, and an n-type GaAs current stripe layer 26 are sequentially formed on an n-type GaAs substrate 21 by the MOCVD method. Then, a resist pattern having a stripe-shaped opening is formed on the upper portion by a photolithograph method. Thereafter, a stripe-shaped window portion 28, reaching p-type InGaAl P cladding layer 25, is formed by etching the n-type GaAs current stripe layer 26 with solution in which GaAs is etched and InGaAlP is not etched. Thereafter, the resist pattern is removed. Next, the second crystal growth is performed by the MOCVD method, thereby forming a p-type GaAs ohmic contact layer 27. In this way, a typical gain waveguide type semiconductor laser element can be obtained. In the IS laser element, Zn is normally used as the p-type dopant and Si is used as the n-type dopant.

The outline of the operation of the above IS laser will be explained as follow.

Metallic electrodes (not shown) are respectively adhered onto the upper and lower surfaces of the formed substrate, shown in FIG. 1, and a forward voltage (the electrode of the upper surface is positive and that of the lower surface is negative) is applied thereto when the laser is operated. A hole is injected into the active layer 24 from the p-type cladding layer 25 and an electron is injected into the active layer 24 from the n-type cladding layer 23. Since n-type current stripe layer 26 and p-type cladding layer 25 are reverse biased, an exciting current locally flows into the portion of p-type ohmic contact layer 27 embedding the stripe-shaped window portion 28. In other words, the implantation of the above carrier is limited to the portion which is close to the portion just below the stripe-shaped window portion 28.

A mixed crystal ratio of materials is determined in order to make the band-gap energy of the active layer 24 smaller than that of the cladding layers 23 and 25. Due to this, the implanted carrier is closed in the thin active layer 24 with a high density and the electron of the conduction band and the hole of the valence band are recombined, thereby emitting light having a wavelength corresponding to the band-gap energy.

On the other hand, the upper and lower surfaces of the active layer 24 are sandwiched between the cladding layers 23 and 25 whose index of refraction is smaller than that of the active layer 24. Due to this, the above-emitted light is closed in the active layer 24. In the case of the semiconductor laser, a active layer area close to the portion just below the stripe-shaped window portion 28, in its longitudinal direction, is a light-emitting region, and reflecting mirror surfaces (not shown) ar formed to be parallel with the both end surfaces of the light-emitting region. The active layer portion, which is sandwiched between the parallel reflecting mirror surfaces, becomes an optical resonator. Light emitted in the active layer is amplified by induced radiation, so that laser beam can be obtained.

Additionally, when layers 23 to 27 are formed on the substrate 21 one over another, n-type GaAs buffer layer 22 relaxes lattice mismatching. At the same time, n-type GaAs buffer layer 22 relaxes the increase of the lattice defect in the crystal growth layer or the generation thereof.

In the above-mentioned semiconductor light-emitting element, the following problems occur in the process of the crystal growth.

Specifically, dopant of the p-type cladding layer 25 hetero junctioning undoped active layer 24, such as Zn, disperses into undoped active layer 24 during the crystal growth. Due to this, there is a problem in that the conductivity type of active layer 24 becomes p-type, thereby increasing the band-gap energy in the active layer. For this reason, the oscillation wavelength is shifted to a short wavelength and the index of refraction of the active layer is decreased, so that the threshold current of the vibration is increased. For the above-mentioned reasons, the yield of the element and the reliance thereof are lowered.

SUMMARY OF THE INVENTION

Accordingly, an object of the present invention is to provide a semiconductor light-emitting element having a double hetero junction structure of a InGaAlP system, which can prevent dopant of the p-type InGaAlP cladding layer, such as Zn, from being dispersed in the $In_{1-y}(Ga_{1-x}Al_x)_y P$ active layer during crystal growth.

Another object of the present invention is to provide a semiconductor light-emitting element wherein a light-emitting wavelength of the light-emitting element is not shifted to a short wavelength.

Another object of the present invention is to provide a semiconductor light-emitting element wherein a threshold current of an oscillation of the light-emitting element is not increased.

Another object of the present invention is to improve the yield and reliance of a semiconductor light-emitting element.

These objects of the present invention can be achieved by the following semiconductor light-emitting element.

More specifically, the semiconductor light-emitting element of the present invention comprises a double hetero junction structure formed by stacking a p-type InGaAlP cladding layer having a band-gap energy which is larger than that of an active layer of $In_{1-y}(Ga_{1-x}Al_x)_y P$ ($0 \leq x < 1$, $y \simeq 0.5$), and an n-type In- GaAlP cladding layer, wherein the active layer is sandwiched between these cladding layers, and an n-type dopant, which does not change the crystal structure of the active layer, is doped in the active layer.

It is considered that the crystal structure of the active layer comprising InGaP or InGaAlP forms a superlattice, as explained later. If, for example, Zn is dispersed in the active layer, the alignment of the superlattice is disturbed, so that InGaP or InGaAlP is alloyed. The band-gap energy Eg of the alloyed active layer is larger than that of the superlattice. Therefore, if the dopant of the p-type cladding layer is dispersed in the active layer, the crystal structure of the active layer changes, the band-gap energy Eg is increased, the oscillation wavelength is shifted to the short wavelength, and the threshold current of the oscillation is raised. In contrast, according to the present invention, in a case where Si is doped into the active layer, since the alignment of the superlattice is not disturbed, the band-gap energy Eg is not changed, and neither the oscillation wavelength nor the threshold current is not changed.

In the present invention, Si, serving as an n-type dopant, is doped into the active layer of InGaP or InGaAlP. Thus, the active layer becomes an n-type active layer. Si is substituted for In, Ga of the elements of III group, and used as a donor. Due to this, when the p-type InGaAlP cladding layer is crystal-grown on the n-type active layer, in which Si is doped, at a predetermined temperature, it is difficult for Zn to enter the active layer since the doped Si has already entered the lattice defect existing in the active layer. Thus, dopant Zn of the p-type cladding layer can be substantially prevented from being dispersed into the active layer, and the alignment of the superlattice is not easily disturbed. The reason why Zn is not dispersed is considered as mentioned above. However, the reason is not limited to the above.

These objects of the present invention can be achieved by the following method for manufacturing a semiconductor light-emitting element.

More specifically, the method for manufacturing the semiconductor light-emitting element having a double hetero junction structure comprises the steps of doping an n-type dopant, which does not change the crystal structure of an active layer of $In_{1-y}(Ga_{1-x}Al_x)_y P$ ($0 \leq x < 1$, $y \simeq 0.5$), into the active layer; forming an n-type InGaAlP cladding layer and a p-type InGaAlP cladding layer; and sandwiching the n-type active layer between these cladding layers.

As an embodiment of the semiconductor light-emitting element of the present invention, a visible light semiconductor laser element of a InGaAlP system and a light-emitting diode element will be explained with reference to the drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a cross sectional view showing a semiconductor light-emitting element of an embodiment according to the present invention;

DETAILED DESCRIPTION OF THE PREFERRED EMBODIMENTS

Figure 1:
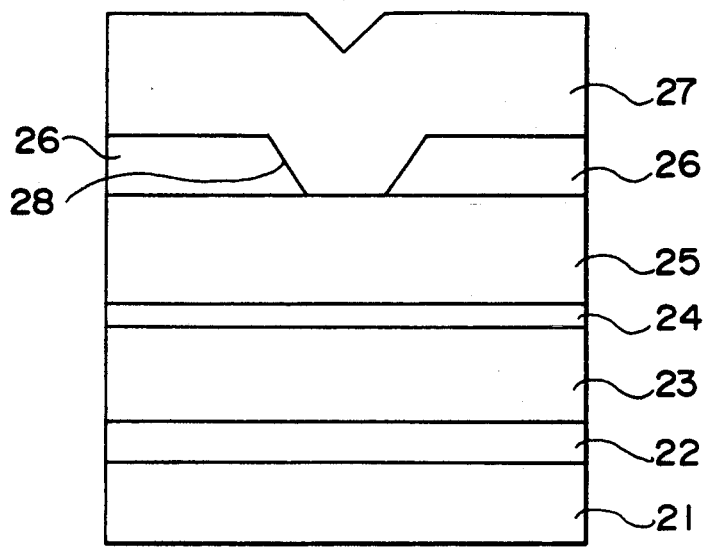
FIG. 1 is a cross sectional view showing a conventional semiconductor light-emitting element.

FIG. 2 is a cross sectional view of the semiconductor element according to the present invention. In FIG. 2, an n-type GaAs buffer layer 2 is formed on an n-type GaAs substrate 1. A double hetero junction structure, which is formed to sandwich an n-type InGaAlP active layer 4 between an n-type InGaAlP cladding layer 3 and a p-type InGaAlP cladding layer 5, is formed on the buffer layer 2. An n-type GaAs current stripe layer 6 having a stripe-shaped window portion 8 and a p-type GaAs ohmic contact layer 7 are sequentially formed. Metallic electrodes 9 and 10 are adhered onto the upper and lower surfaces of the substrate.

The outline of the method for manufacturing the above semiconductor laser element will be explained with reference to FIGS. 3A and 3B.

Figure 3A:
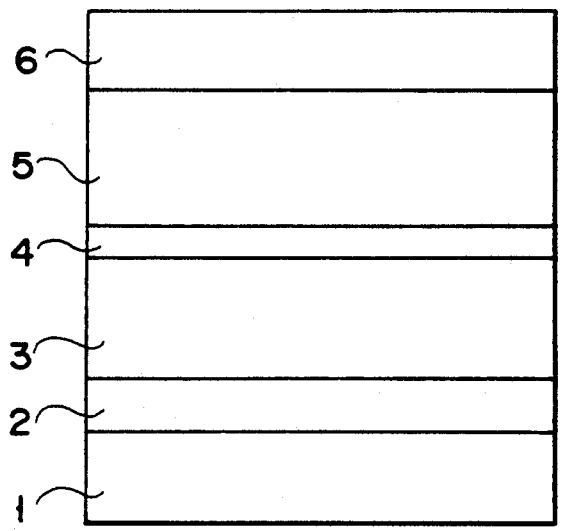
FIGS. 3A and 3B are cross sectional views showing a manufacturing process of the semiconductor element of FIG. 2.
Figure 3B:
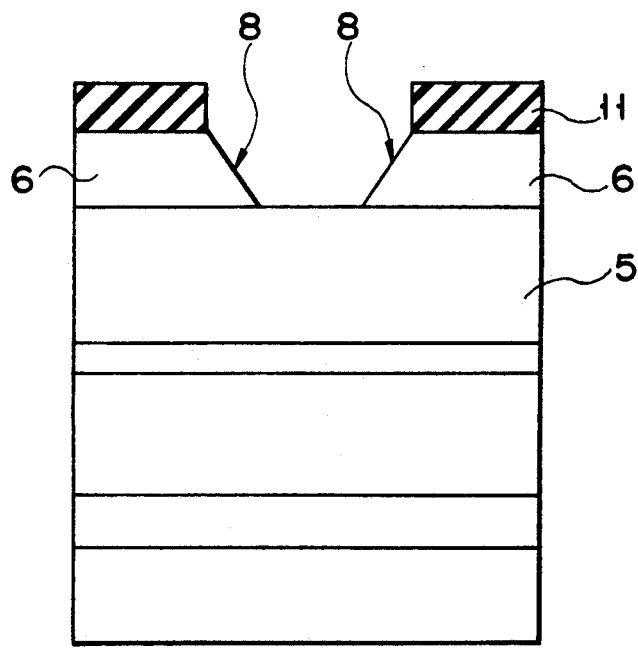

FIGS. 3A and 3B, it is assumed that a donor concentration is n and an acceptor concentration is p. The n-type GaAs buffer layer 2 wherein $n = 5 \times 10^{17}$ atoms/cm$^3$ and its thickness is 0.5 μm, the n-type $In_{1-y}(Ga_{1-s}Al_s)_y P$ cladding layer 3 wherein $n = 5 \times 10^{17}$ atoms/cm$^3$ and its thickness is 0.9 μm, the n-type $In_{1-y}(Ca_{1-x}A_{;x})_y P$ active layer 4 wherein $n = 1 \times 10^{19}$ atoms/cm$^3$ and its thickness is 0.06 μm, the p-type $In_{1-y}(Ga_{1-s}Al_s)_y P$ cladding layer 5 wherein $p = 3 \times 10^{17}$ atoms/cm$^3$ and its thickness is 0.9 μm, and the n-type GaAs current stripe layer 6 wherein $n = 2 \times 10^{18}$ atoms/cm$^3$ and its thickness is 0.6 μm are sequentially formed on the n-type GaAs substrate 1 by a metalorganic chemical vapor deposition method (MOCVD). In this case, the crystal growth temperature is about 720° C. In the present invention, $x = 0$, $y = 0.5$, and $s = 0.7$ and Si is used as an n-type impurity material (donor) and Zn is used as a p-type impurity material (acceptor).

As shown in FIG. 3B, a resist film 11 having a stripe-shaped opening is formed on n-type current stripe layer 6 by a photolitograph method. The resist film 11 is used as a mask, and stripe-shaped window portion 8 is formed in the n-type current stripe layer 6 by etching the n-type current stripe layer 6 with etchant of $H_2SO_4$:$H_2O_2$:$H_2O_2 = 8:1:1$ having selectivity in which GaAs can be etched but InGaAlP cannot be etched at a temperature of 20° C.

Then, the resist film 11 is removed and a surface cleaning process is performed. Thereafter, a second crystal growth is performed by MOCVD method and a p-type GaAs ohmic contact layer 7 is formed. Then, the metallic electrodes 9 and 10 are adhered onto the upper and lower surfaces of the formed substrate by vapor deposition, thereby obtaining a semiconductor laser element as shown in FIG. 2.

The active layer of the laser element according to the above embodiment is formed of an InGap crystal wherein the mixed ratio is x=0, y=0.5. The semiconductor laser is different from the conventional semiconductor laser element in that Si is doped in the InGaP active layer and the InGap active layer is n-conductivity type. However, the semiconductor laser element of the present invention is substantially equal to the conventional laser element in operation and function as a laser element.

In a case of an InGaP crystal, there is a relationship between the crystal growth temperature and the band-gap energy Eg as shown in FIG. 5 (Reference: Journal of Crystal Growth, 93 (1988), p 406 to p 411). In FIG. 5, the horizontal axis denotes the InGaP crystal growth temperature and the vertical axis denotes the band-gap energy Eg. To obtain a laser oscillation wavelength of about 670+10 nm, the growth temperature must be 650° to 720° C. Under this growth temperature, undoped InGaP forms a superlattice. However, there is a lattice defect even in the superlattice. Then, if Zn is dispersed in the lattice defect, the alignment of the superlattice is disturbed, so that InGaP is alloyed. Therefore, if the dopant of the p-type cladding layer is dispersed in the active layer, the crystal structure of the active layer changes, the band-gap energy Eg is increased, the oscillation wavelength is shifted to the short wavelength, and the threshold current of the oscillation is raised. In contrast, according to the present invention, in a case where Si is doped into the active layer, since the alignment of the superlattice is not disturbed, the band-gap energy Eg is not changed, and neither the oscillation wavelength nor the threshold current is changed.

In the above-mentioned semiconductor laser element, Si, serving as an n-type dopant, is doped into the InGaP active layer. Thus, the active layer becomes an n-type active layer. Therefore, dopant Zn of the p-type cladding active layer can be prevented from being dispersed into the active layer by Si, and the alignment of the superlattice is not easily disturbed. The reason is that when Si is substituted for In, Ga of the elements of III group, and used as a donor, and when p-type InGaAlP cladding layer is crystal-grown on the n-type active layer, in which Si is doped, at a predetermined temperature, Si enters the lattice defect existing in the active layer. Thus, Si covers the lattice defect. However, the reason why Zn is prevented from being dispersed is not limited to the above reason.

The above embodiment explained the active layer of the ternary mixed crystal which is $In_{1-y}(Ga_{1-x}Al_x)_y$ P active layer where y=0.5 and x=0. However, the present invention can be applied to the active layer of the quaternary mixed crystal of x≠0 such as $In_{0.5}(Ga_{0.8}Al_{0.2})_{0.5}P$ wherein x=0.2. In this case, it is necessary to satisfy the laser oscillation condition while the lattice matching of both active layer and the cladding layer is maintained by selecting the composition ratio x, y of the active layer and the composition ratio s, y of the cladding layer.

Figure 4:
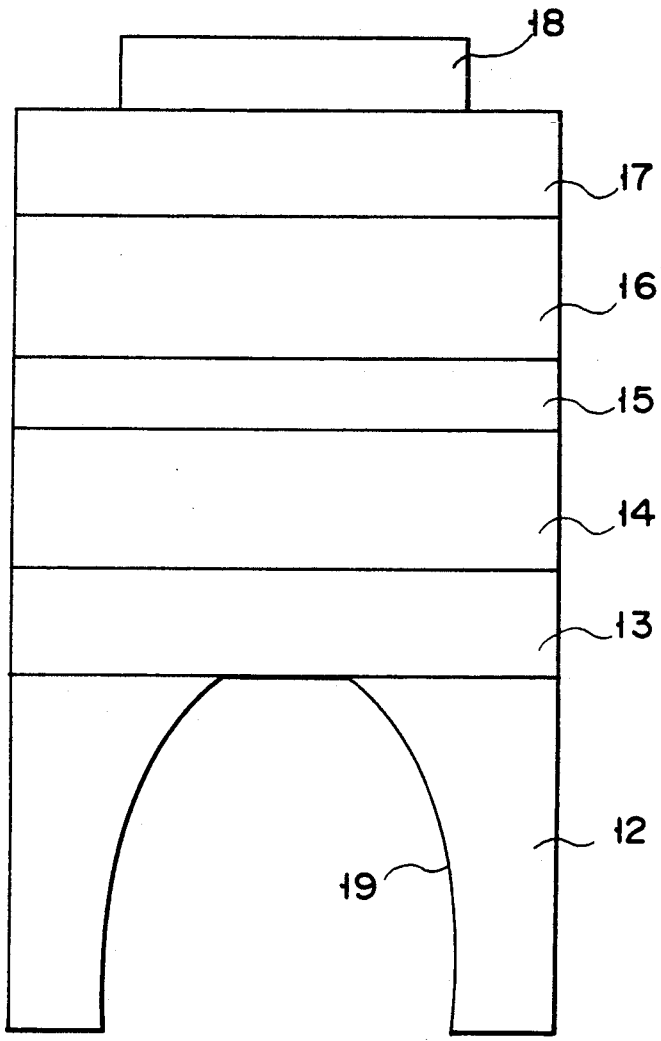
FIG. 4 is a cross sectional view showing a light emitting diode (LED) according to the present invention; an FIG. 5 is a graph showing a relationship between a InGaP crystal growth temperature and a band-gap energy Eg.

Moreover, the above embodiment explained the semiconductor laser element having an oscillation wavelength about 670 nm as a semiconductor light-emitting element. However, the present invention is not limited to this element. The present invention can be applied to a semiconductor laser element having a different oscillation wavelength from the embodiment or a light-emitting diode (LED) for optical communication. FIG. 4 shows an LED having an inner stripe structure. In FIG. 4, reference numeral 12 denotes a GaAs substrate; 13: an n-type GaAs buffer layer; 14: an n-type $In_{0.5}(Ga_{0.3}Al_{0.7})_{0.5}$ P cladding layer; 15: an n-type $In_{0.5}(Ga_{0.8}Al_{0.2})_{0.5}$ P active layer; 16: a p-type $In_{0.5}(Ga_{0.3}Al_{0.7})_{0.5}$ P cladding layer; 17: a p-type GaAlAs conductive layer; and 18: a p-type GaAs contact layer. These layers are sequentially stacked on the substrate, and metallic electrodes are adhered onto the upper and lower surfaces (not shown). The above structure is substantially the same as the structure of the laser element of FIG. 2 except that thickness of the layer is a little different of that of the laser element of FIG. 2 and the substrate 12 is removed at a portion 19 by etching, in order that light is not absorbed by the substrate 12, since light emits in the vertical direction.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor light-emitting element, comprising a double hereto junction structure formed by stacking a P-type InGaAlP cladding layer (5) having a band-gap energy which is greater than a band gap energy of an active layer (4) of $In_{1-y}(Ga_{1-x}Al_x)_yP (0 \leq x < 1, y \approx 0.5)$ and an n-type InGaAlP cladding layer (3), wherein said active layer (4) is sandwiched between said cladding layers (3 and 5), and wherein said active layer (4) includes silicon means, comprising an n-type dopant, for preventing diffusion of a p-type dopant from the p-type InGaAlP cladding layer (5) into the active layer (4).

2. A semiconductor light-emitting element according to claim 1, wherein said active layer (4) is InGaP.

3. A semiconductor light-emitting element according to claim 1, wherein said semiconductor light-emitting element is a semiconductor laser element having an oscillation wavelength of about 670 nm.

4. A semiconductor light-emitting element according to claim 1, wherein said active layer (4) is $In_{0.5}(Ga_{0.8}Al_{0.2})_{0.5}P$.

5. A semiconductor laser element, which is formed by sequentially forming an n-type GaAs substrate (1), and n-type GaAs buffer layer (2) having a donor concentration of $5 \times 10^{17}$ atoms/cm$^3$ and a thickness of 0.5 μm, and n-type $In_{1-y}Ga_{1-s}Al_s)yP$ cladding layer (3) having a donor concentration of $5 \times 10^{17}$ atoms/cm$^3$ and a thickness of 0.9 μm, an n-type $In_{1-y}(Ga_{1-x}Al_x)yP$ active layer (4) having a donor concentration of $1 \times 10^{19}$ atoms/cm$^3$ and a thickness of 0.06 μm, a p-type $In_{1-y}(Ga_{1-s}Al_s)yP$ cladding layer (5) having an acceptor concentration of $3 \times 10^{17}$ atoms/cm$^3$ and a thickness of 0.9 μm, an n-type GaAs current stripe layer (6) having a stripe window portion (8), a donor concentration of $2 \times 10^{18}$ atoms/cm$^3$, and a thickness of 0.6 μm, and a p-type GaAs ohmic contact layer (7), wherein metallic electrodes (9, 10) are adhered onto the upper and lower surfaces, respectively.

6. A light-emitting diode, which is formed by sequentially forming a GaAs substrate (12), an n-type GaAs buffer layer (13), an n-type $In_{0.5}(Ga_{0.3}Al_{0.7})0.5P$ cladding layer (14), an n-type $In_{0.5}(Ga_{0.8}Al_{0.2})_{0.5}P$ active layer (15), a p-type $In_{0.5}(Ga_{0.3}Al_{0.7})_{0.5}P$ cladding layer (16), into which zinc, serving as a p-type dopant, is doped, a p-type GaAlAs conductive layer (17), and a p-type GaAs contact layer (18), wherein metallic electrodes are adhered onto upper and lower surfaces of the light-emitting diode, respectively, and wherein said n-type active layer includes silicon means used as a donor for preventing diffusion of the zinc in the p-type InGaAlP cladding layer (16) into the active layer (15).

7. A semiconductor light-emitting element, comprising a double hereto junction structure formed by stacking a p-type InGaAlP cladding layer (5) having a band-gap energy which is greater than a band-gap energy of an active layer (4) of $In_{1-y}(Ga_{1-x}Al_x)_yP)0 \leq x < 1$, $y \simeq 0.5$), and an n-type InGaAlP cladding layer (3), wherein said active layer (4) is sandwiched between said cladding layers (3 and 5), and wherein said active layer (4) includes silicon having a concentration of $1 \times 10^{19}$ atoms/cm$^3$ comprising an n-type dopant, for preventing diffusion of a p-type dopant from the p-type InGaAlP cladding layer (5) into the active layer (4).

* * * * *